(12) United States Patent
Won et al.

(10) Patent No.: US 12,187,941 B2
(45) Date of Patent: *Jan. 7, 2025

(54) CORE SHELL QUANTUM DOT AND ELECTRONIC DEVICE INCLUDING THE SAME

(71) Applicant: SAMSUNG ELECTRONICS CO., LTD., Suwon-si (KR)

(72) Inventors: Yuho Won, Seoul (KR); Yong Wook Kim, Yongin-si (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,983

(22) Filed: Jul. 18, 2022

(65) Prior Publication Data

US 2022/0348824 A1    Nov. 3, 2022

Related U.S. Application Data

(63) Continuation of application No. 16/739,595, filed on Jan. 10, 2020, now Pat. No. 11,390,804.

(30) Foreign Application Priority Data

Jan. 11, 2019    (KR) .................. 10-2019-0004231

(51) Int. Cl.
*C09K 11/88* (2006.01)
*C09K 11/54* (2006.01)
(Continued)

(52) U.S. Cl.
CPC ............ *C09K 11/883* (2013.01); *C09K 11/54* (2013.01); *C09K 11/565* (2013.01); *H01L 33/06* (2013.01); *H01L 33/28* (2013.01)

(58) Field of Classification Search
CPC ..... C09K 11/883; C09K 11/54; C09K 11/565; H01L 33/06; H01L 33/28
See application file for complete search history.

(56) References Cited

U.S. PATENT DOCUMENTS 9,412,916 B2    8/2016    Xu et al.
9,537,059 B2    1/2017    Xu et al.
(Continued)

FOREIGN PATENT DOCUMENTS

JP    2015505860 A    2/2015
JP    2018092180 A    6/2018
(Continued)

OTHER PUBLICATIONS

ACS Omega 2018, 3, 6703-6709.
(Continued)

*Primary Examiner* — Matthew L Reames
(74) *Attorney, Agent, or Firm* — CANTOR COLBURN LLP

(57) ABSTRACT

A quantum dot having a core including a first semiconductor nanocrystal including zinc, selenium, and tellurium, and a semiconductor nanocrystal shell disposed on the surface of the core, the shell including zinc, selenium, and sulfur. The quantum dot is configured to emit green light, the quantum dot does not include cadmium, and the quantum dot has a mole ratio Te:Se of tellurium relative to selenium of greater than about 0.05 and less than or equal to about 0.5:1. A method of producing the quantum dot and an electronic device including the same.

15 Claims, 5 Drawing Sheets

(51) Int. Cl.
*C09K 11/56* (2006.01)
*H01L 33/06* (2010.01)
*H01L 33/28* (2010.01)

(56) References Cited

U.S. PATENT DOCUMENTS

| | | | |
|---|---|---|---|
| 10,035,952 B2 | 7/2018 | Koole et al. | |
| 10,090,443 B2 | 10/2018 | Xu et al. | |
| 10,287,490 B2 | 5/2019 | Bohmer et al. | |
| 11,319,487 B2 | 5/2022 | Lee et al. | |
| 11,767,472 B2 | 9/2023 | Lee et al. | |
| 2019/0157595 A1 | 5/2019 | Seo et al. | |
| 2019/0367810 A1 | 12/2019 | Omata et al. | |

FOREIGN PATENT DOCUMENTS

| | | |
|---|---|---|
| JP | 2018115315 A | 7/2018 |
| KR | 20180124765 A | 11/2018 |

OTHER PUBLICATIONS

Hung Chia Wang,, et al., "Cadmium-Free InP/ZnSeS/ZnS Heterostructure-Based Quantum Dot Light-Emitting Diodes with a ZnMgO Electron Transport Layer and a Brightness of Over 10 000 cd m-2", Small 2017, 1603962, 7 pp.
Jehoon Lim, et al., ACSNANO, vol. 7, No. 10, 9019-9026.
Juan Guan, Synthesis and Structural Characterization of ZnTe/ZnSe core/shell Tunable QDs, 2008, MS thesis, MIT, 62 pp.
Simon M. Fairclough, et al., Growth and Characterization of Strained and Alloyed type-II ZnTe/ZnSe core/shell nanocrystals, J. Phys. Chem. C 2012, 116, 26898, 10 pp.
English Translation of Office Action dated Aug. 16, 2024, issued in corresponding Korean Patent Application No. 10-2020-0003677, 6 pp.
Office Action dated Aug. 16, 2024, issued in corresponding Korean Patent Application No. 10-2020-0003677, 5 pp.

CORE SHELL QUANTUM DOT AND ELECTRONIC DEVICE INCLUDING THE SAME

CROSS-REFERENCE TO RELATED APPLICATION

This application claims priority to U.S. patent application Ser. No. 16/739,595 filed Jan. 10, 2020, now U.S. Pat. No. 11,390,804, which in turn claims priority to Korean Patent Application No. 10-2019-0004231 filed in the Korean Intellectual Property Office on Jan. 11, 2019, and all the benefits accruing therefrom under 35 U.S.C. §§ 119, 120, the entire contents of which are herein incorporated by reference.

BACKGROUND

1. Field

A core shell quantum dot and an electronic device including the same are disclosed.

2. Description of the Related Art

Nanoparticles have physical characteristics (e.g., energy bandgaps, melting points, etc.) that are controlled depending on particle sizes unlike bulk materials. For example, semiconductor nanocrystal particles also referred to as quantum dots are crystalline materials having sizes of several nanometers. The semiconductor nanocrystal particles are of such small size that they have a large surface area per unit volume and exhibit quantum confinement effects, and thus have different properties and characteristics of bulk materials having the same composition. Quantum dots may absorb light from an excitation source to attain an excited state and then emit energy corresponding to their energy bandgaps.

SUMMARY

An embodiment provides a cadmium-free semiconductor nanocrystal particle capable of emitting green light with improved efficiency.

Another embodiment provides a method of producing the semiconductor nanocrystal particle.

Another embodiment provides an electronic device including the aforementioned semiconductor nanocrystal particle.

In an embodiment, a quantum dot includes a core including a first semiconductor nanocrystal including zinc, selenium, and tellurium, and a semiconductor nanocrystal shell disposed on the surface of the core, the shell including zinc, selenium, and sulfur, wherein the quantum dot is configured to emit green light, the quantum dot does not include cadmium, and the quantum dot has a mole ratio Te:Se of tellurium relative to selenium of greater than about 0.05:1 and less than or equal to about 0.5:1.

The green light may have a maximum peak wavelength of greater than or equal to about 500 nanometers (nm).

The green light may have a maximum peak wavelength of less than or equal to about 550 nm.

The quantum dot may have a mole ratio Te:Se of tellurium relative to selenium of greater than or equal to about 0.055:1.

The quantum dot may have a mole ratio Te:Se of tellurium relative to selenium of greater than or equal to about 0.06:1.

The quantum dot may have a mole ratio S:Se of sulfur relative to selenium of greater than or equal to about 0.5:1, for example, greater than or equal to about 0.6:1, greater than or equal to about 0.7:1, greater than or equal to about 0.8:1, greater than or equal to about 0.9:1, greater than or equal to about 1:1, or greater than or equal to about 1.05:1.

The quantum dot may have a mole ratio of sulfur relative to selenium of less than or equal to about 2:1, for example, less than or equal to about 1.9:1, less than or equal to about 1.8:1, less than or equal to about 1.7:1, less than or equal to about 1.6:1, less than or equal to about 1.5:1, less than or equal to about 1.4:1, or less than or equal to about 1.3:1.

The quantum dot may have a mole ratio (Se+S)/Te of a sum of sulfur and selenium relative to tellurium of greater than or equal to about 15:1.

The quantum dot may have a mole ratio (Se+S)/Te of a sum of sulfur and selenium relative to tellurium of greater than or equal to about 20:1.

In the quantum dot, a mole ratio of zinc relative to a sum of sulfur and selenium may be less than or equal to about 1.1:1.

The core may include $ZnTe_xSe_{1-x}$, wherein, x is greater than or equal to about 0.1 and less than or equal to about 0.5.

The semiconductor nanocrystal shell may have a composition that varies in a radial direction.

In the semiconductor nanocrystal shell, a concentration of the sulfur increases toward the surface of the quantum dot.

The semiconductor nanocrystal shell may include a first layer disposed directly on the core and a second layer disposed on the first layer, wherein the first layer may include a second semiconductor nanocrystal and the second layer may include a third semiconductor nanocrystal having a different composition from the second semiconductor nanocrystal.

The second semiconductor nanocrystal may include zinc, selenium, and optionally sulfur.

The third semiconductor nanocrystal may include zinc and sulfur.

The second layer may be an outermost layer and the third semiconductor nanocrystal may not include selenium.

The quantum dot may have an average particle size of greater than or equal to about 6 nm.

The quantum dot may have an average particle size of greater than or equal to about 10 nm.

The quantum dot may constitute a population having a standard deviation of a particle size distribution of less than or equal to about 10 percent.

The quantum dot may have quantum efficiency of greater than or equal to about 60 percent.

A valence band edge and a conduction band edge of the core may be in the bandgap of the semiconductor nanocrystal shell.

In another embodiment, a light emitting device may include a first electrode and a second electrode facing each other; and a quantum dot emission layer disposed between the first electrode and the second electrode and including a plurality of quantum dots, wherein the plurality of quantum dots may include the aforementioned quantum dot.

A charge auxiliary layer may be included between the first electrode and the quantum dot emission layer, between the second electrode and the quantum dot emission layer, or between the first electrode and the quantum dot emission layer and between the second electrode and the quantum dot emission layer.

The charge auxiliary layer may include a charge transport layer, a charge injection layer, or a combination thereof.

The electroluminescent device may have peak external quantum efficiency of greater than or equal to about 4 percent.

The electroluminescent device may emit light having a maximum luminance of greater than or equal to about 5,000 candela per square meter (cd/m$^2$).

In another embodiment, an electronic device includes the aforementioned semiconductor nanocrystal particle.

The electronic device may be a display device, a light emitting diode (LED), a quantum dot light emitting diode (QLED), an organic light emitting diode (OLED), a sensor, an image sensor, or a solar cell.

The cadmium-free quantum dot may be capable of emitting green light with improved efficiency. The quantum dot according to an embodiment may be applied to various display devices, biolabeling (biosensor, bioimaging), a photodetector, a solar cell, a hybrid composite, and the like. The quantum dot of an embodiment may exhibit improved external quantum efficiency and maximum luminance when applied to an electroluminescent device. The quantum dot of an embodiment may exhibit a reduced full width at half maximum (FWHM) and increased quantum efficiency.

DETAILED DESCRIPTION

Figure 1:
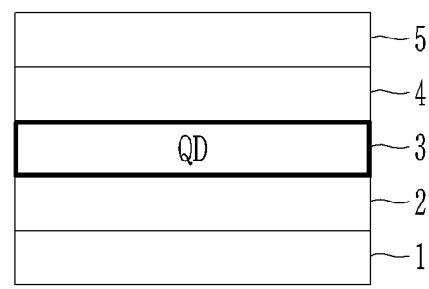
FIG. 1 is a schematic cross-sectional view of a QD LED device according to non-limiting embodiment.

Advantages and characteristics of this disclosure, and a method for achieving the same, will become evident referring to the following example embodiments together with the drawings attached hereto. This invention may, however, be embodied in many different forms, and should not be construed as being limited to the embodiments set forth herein. Rather, these embodiments are provided so that this disclosure will be thorough and complete, and will fully convey the scope of the invention to those skilled in the art.

If not defined otherwise, all terms (including technical and scientific terms) in the specification may be defined as commonly understood by one skilled in the art. The terms defined in a generally-used dictionary may not be interpreted ideally or exaggeratedly unless clearly defined.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or."

As used herein, the term "and/or" includes any and all combinations of one or more of the associated listed items. In addition, unless explicitly described to the contrary, the word "comprise" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value As used herein, when a definition is not otherwise provided, "substituted" refers to the case where in a compound or a corresponding moiety hydrogen is replaced by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, "hydrocarbon group" refers to a group including carbon and hydrogen (e.g., an alkyl, alkenyl, alkynyl, or aryl group). The hydrocarbon group may be a group having a mono-valence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of at least one hydrogen from an aromatic group (e.g., a phenyl or naphthyl group).

Herein, "hetero" refers to one including 1 to 3 heteroatoms of N, O, S, Si, P, or a combination thereof.

Herein, "Group" refers to a group of Periodic Table.

Semiconductor nanocrystal particles (hereinafter, also referred to as quantum dots) may absorb light from an excitation source and may emit energy corresponding to their energy bandgap. Energy bandgaps of quantum dots may be changed according to the particle size and composition of quantum dots. For example, as the particle sizes of quantum dots increase, the quantum dots may have narrow energy bandgaps and increased light emitting wavelengths. Semiconductor nanocrystals have drawn attention as light emitting materials in various fields, particularly in a field of a display device, an energy device, or a bioluminescent device.

Many of quantum dots having photoluminescence properties that exhibit commercially viable emission and quantum efficiency may be based on cadmium (Cd). However, cadmium may cause severe environment/health problems and may be a restricted element by Restriction of Hazardous Substances Directive (RoHS) in a plurality of countries. Therefore, it is necessary to develop cadmium-free quantum dots which may emit light of a desired wavelength while having improved light emitting characteristics (for example, as applied to an electroluminescent device) and does not include harmful heavy metals such as cadmium and lead.

A quantum dot according to an embodiment includes a ZnTeSe-based material (e.g., alloy) core, and further include a Zn, Se, and Se shell formed about the core. The quantum dot of the embodiment may have a predetermined composition as a whole (as below) and thereby, may emit green light with improved efficiency even though the quantum dot does not include cadmium, and may be recognized by a person of ordinary skill as being cadmium-free. The quantum dots according to an embodiment have this structure and composition and accordingly, may exhibit improved properties in an electroluminescent device.

Accordingly, a quantum dot (or quantum dots) according to an embodiment includes (or include) a core including a first semiconductor to nanocrystal including zinc, selenium, and tellurium, and a semiconductor nanocrystal shell disposed on the surface of the core (e.g., at least a portion of the surface of the core), the shell including zinc, selenium, and sulfur. The quantum dot(s) does not include cadmium. The quantum dot(s) are configured to emit green light if irradiated with excitation light or applied, i.e., present, in an emission layer of an electroluminescent device. The quantum dot(s) have a mole ratio Te:Se of tellurium relative to selenium may be greater than about 0.05:1 and less than or equal to about 0.5:1.

The green light may have a maximum peak wavelength of greater than or equal to about 500 nm, for example, greater than or equal to about 510 nm, or greater than or equal to about 520 nm. The green light may have a maximum peak wavelength of less than or equal to about 550 nm, for example, less than or equal to about 540 nm, or less than or equal to about 535 nm. The green light may have a maximum peak wavelength of about 515 nm to about 530 nm.

The quantum dot(s) of an embodiment may emit green light having improved quantum efficiency (e.g., greater than or equal to about 60 percent (%), greater than or equal to about 61%, greater than or equal to about 62%, greater than or equal to about 63%, greater than or equal to about 64%, or greater than or equal to about 65%), by having the aforementioned structure and a composition which will be described later. The quantum dot(s) of an embodiment may emit green light having a full width at half maximum (FWHM) of less than or equal to about 60 nm, for example, less than or equal to about 55 nm, less than or equal to about 50 nm, or less than or equal to about 45 nm.

The core(s) may include a first semiconductor nanocrystal including zinc, selenium, and tellurium. The core may include $ZnTe_xSe_{1-x}$, wherein, x is greater than or equal to about 0.1 and less than or equal to about 0.5. In the core(s), a content of the tellurium (or the x in the above formula) may be greater than or equal to about 0.1 moles (mol), for example, greater than or equal to about 0.11 mol, greater than or equal to about 0.12 mol, greater than or equal to about 0.13 mol, greater than or equal to about 0.14 mol, greater than or equal to about 0.15 mol, greater than or equal to about 0.16 mol, greater than or equal to about 0.17 mol, greater than or equal to about 0.18 mol, or greater than or equal to about 0.19 mol with respect to 1 mol of the selenium. In the core(s), a content of the tellurium may be less than or equal to about 0.5 mol, for example, less than or equal to about 0.49 mol, less than or equal to about 0.48 mol, less than or equal to about 0.47 mol, less than or equal to about 0.46 mol, less than or equal to about 0.45 mol, less than or equal to about 0.44 mol, less than or equal to about 0.43 mol, less than or equal to about 0.42 mol, less than or equal to about 0.41 mol, less than or equal to about 0.40 mol, less than or equal to about 0.39 mol, less than or equal to about 0.38 mol, or less than or equal to about 0.37 mol with respect to 1 mol of the selenium. When examined through an X-ray diffraction analysis, a peak of the core may be shifted from ZnSe peaks toward ZnTe, and this result implies that the core forms a ZnTeSe alloy. When the shell, which is described below, is disposed on the core having the aforementioned composition, final quantum dots may emit green light with little or no decrease in efficiency. Without wishing to be bound by any theory, the adoption of the shell having a composition that will be described below along with an increased amount of tellurium may enable an energy bandgap alignment between the core and the shell layer in final quantum dots to efficiently confine excitons and thereby, maintain improved luminous efficiency as well as obtain a desired light emitting wavelength.

The semiconductor nanocrystal shell in the quantum dot(s) according to an embodiment includes zinc, selenium, and sulfur. The shell may be a multi-layered shell including a plurality of layers. Adjacent layers in the plurality of layers of the shell may include a semiconductor material having a different composition. The multi-layered shell may include a first layer disposed directly on the core and a second layer disposed on the first layer. The first layer may include a second semiconductor nanocrystal. The second layer may include a third semiconductor nanocrystal having a different composition from that of the second semiconductor nanocrystal. The second layer may be an outermost layer of the quantum dots. The second semiconductor nanocrystal may include zinc, selenium, and optionally, sulfur. The third semiconductor nanocrystal may include zinc and sulfur. The third semiconductor nanocrystal may not include selenium.

In an embodiment, the quantum dot(s) may have a ZnSe layer(s) (e.g., a first layer) directly disposed on the aforementioned core. The ZnSe layer(s) may not include S. In an embodiment, a thickness of the first layer including ZnSe may be greater than or equal to about 4 monolayers, for example, greater than or equal to about 5 monolayers and less than or equal to about 10 monolayers, for example, less than or equal to about 9 monolayers.

In the multi-layered shell, a thickness of each layer may be determined by considering a composition of the entire quantum dots. The quantum dots may have a layer composed of ZnS in the outermost. In a multi-layered shell, a thickness of each layer is adjusted to satisfy a composition of the entire quantum dots described later.

In the shell or the multi-layered shell, each layer may be a gradient alloy having a composition that changes or varies in a radial direction. In an embodiment, a concentration (i.e., a content) of sulfur in the semiconductor nanocrystal shell may be increased toward the surface of the quantum dots. For example, in the shell, the concentration (content) of the sulfur may have a concentration gradient that increases as being apart from the core.

The quantum dot(s) may have a mole ratio Te:Se of tellurium relative to selenium (e.g., as measured by an inductively coupled plasma-atomic emission spectroscopy (ICP-AES)) of greater than about 0.05:1, for example, greater than or equal to about 0.055:1, greater than or equal to about 0.06:1, greater than or equal to about 0.065:1, or greater than or equal to about 0.07:1. The mole ratio of tellurium relative to selenium may be less than or equal to about 0.5:1, for example, less than or equal to about 0.49:1, less than or equal to about 0.48:1, less than or equal to about 0.47:1, less than or equal to about 0.46:1, less than or equal to about 0.45:1, less than or equal to about 0.44:1, less than or equal to about 0.43:1, less than or equal to about 0.42:1, less than or equal to about 0.41:1, less than or equal to about 0.40:1, less than or equal to about 0.39:1, less than or equal to about 0.38:1, less than or equal to about 0.37:1, less than or equal to about 0.36:1, less than or equal to about 0.35:1, less than or equal to about 0.34:1, less than or equal to about 0.33:1, less than or equal to about 0.32:1, less than or equal to about 0.31:1, less than or equal to about 0.30:1, less than or equal to about 0.29:1, less than or equal to about 0.28:1, less than or equal to about 0.27:1, less than or equal to about 0.26:1, less than or equal to about 0.25:1, less than or equal to about 0.24:1, less than or equal to about 0.23:1, less than or equal to about 0.22:1, less than or equal to about 0.21:1, less than or equal to about 0.20:1, less than or equal to about 0.19:1, less than or equal to about 0.18:1, less than or equal to about 0.17:1, less than or equal to about 0.16:1, less than or equal to about 0.15:1, less than or equal to about 0.14:1, less than or equal to about 0.13:1, less than or equal to about 0.12:1, less than or equal to about 0.1:1, or less than or equal to about 0.09:1. The mole ratio of tellurium relative to selenium may be in the range of about 0.06:1 to about 0.1:1.

The quantum dot(s) may have a mole ratio Te:S of tellurium relative to sulfur (for example, as measured by an inductively coupled plasma-atomic emission spectroscopy (ICP-AES)) of greater than or equal to about 0.02:1, for example, greater than or equal to about 0.03:1, greater than or equal to about 0.035:1, greater than or equal to about 0.04:1, greater than or equal to about 0.045:1, greater than or equal to about 0.05:1, greater than or equal to about 0.055:1, greater than or equal to about 0.06:1 or greater than or equal to about 0.065:1. The mole ratio of tellurium relative to sulfur may be less than or equal to about 0.2:1, for example, less than or equal to about 0.15:1, less than or equal to about 0.14:1, less than or equal to about 0.13:1, less than or equal to about 0.12:1, less than or equal to about 0.11:1, less than or equal to about 0.1:1, less than or equal to about 0.09:1, less than or equal to about 0.08:1, or less than or equal to about 0.075:1.

In the quantum dot, the zinc content (e.g., the zinc concentration) may vary depending on the Se and S content.

In the quantum dot(s), a mole ratio S:Se of sulfur relative to selenium may be greater than or equal to about 0.6:1, for example, greater than or equal to about 0.7:1, greater than or equal to about 0.8:1, greater than or equal to about 0.9:1, greater than or equal to about 0.95:1, greater than or equal to about 1:1, or greater than or equal to about 1.05:1. In the quantum dot(s) of an embodiment, the mole ratio of sulfur relative to selenium may be less than or equal to about 2:1, less than or equal to about 1.95:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, or less than or equal to about 1.2:1.

The quantum dot(s) may have a mole ratio (Se+S)/Te of a sum of sulfur and selenium relative to tellurium of greater than or equal to about 15:1, greater than or equal to about 16:1, greater than or equal to about 17:1, greater than or equal to about 18:1, greater than or equal to about 19:1, greater than or equal to about 20:1, greater than or equal to about 21:1, greater than or equal to about 22:1, greater than or equal to about 23:1, greater than or equal to about 24:1, or greater than or equal to about 25:1. The quantum dot(s) may have a mole ratio (Se+S)/Te of a sum of sulfur and selenium relative to tellurium of less than or equal to about 60:1, less than or equal to about 59:1, less than or equal to about 58:1, less than or equal to about 57:1, less than or equal to about 56:1, less than or equal to about 55:1, less than or equal to about 54:1, less than or equal to about 53:1, less than or equal to about 52:1, less than or equal to about 51:1, less than or equal to about 50:1, less than or equal to about 49:1, less than or equal to about 48:1, or less than or equal to about 47:1.

The quantum dot(s) may have a mole ratio S:Zn of sulfur relative to zinc (for example, as measured by an inductively coupled plasma-atomic emission spectroscopy (ICP-AES)) of greater than or equal to about 0.3:1, greater than or equal to about 0.35:1, greater than or equal to about 0.4:1, or greater than or equal to about 0.45:1. The quantum dot(s) may have a mole ratio S:Zn may be less than or equal to about 0.8:1, less than or equal to about 0.7:1, less than or equal to about 0.6:1, or less than or equal to about 0.55:1.

The quantum dots may have any shape. The quantum dot(s) may have spherical shapes, polyhedron shapes, multi-pod shapes, or a combination thereof.

The core(s) may have an average size of greater than or equal to about 3 nm, or greater than or equal to about 3.5 nm. The core(s) may have an average size of less than or equal to about 5 nm, for example, less than or equal to about 4 nm.

The aforementioned quantum dot(s) may constitute a quantum dot population. The quantum dot (or quantum dot population) may have a (average) particle size of greater than or equal to about 6 nm, for example, greater than or equal to about 7 nm, or greater than or equal to about 8 nm. Herein the sizes of the quantum dots may refer to diameters (or diameters calculated from electron microscope 2D images of the quantum dots under the assumption that they have spherical shapes, when the quantum dots do not have spherical shapes). The (average) particle size of the quantum dots (or population) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm.

The population of the aforementioned quantum dots may have a standard deviation of less than or equal to about 10%, less than or equal to about 9%, or less than or equal to about 8% of an average size thereof.

The quantum dots may include organic ligands on the surfaces. The organic ligands may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein, R and R' are independently a C1 to C40 substituted or unsubstituted aliphatic hydrocarbon, or a C6 to C40 substituted or unsubstituted aromatic hydrocarbon, or a combination thereof), or a combination thereof. The ligands may be used alone or in a mixture of two or more compounds.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine compound or an oxide compound thereof such as methyl phosphine, ethyl phosphine, propyl phosphine, butyl phosphine, pentyl phosphine, tributyl phosphine, trioctyl phosphine, and the like phosphines; methyl phosphine oxide, ethyl phosphine oxide, propyl phosphine oxide, butyl phosphine oxide, trioctyl phosphine oxide, and the like; diphenyl phosphine, tri phenyl phosphine compound or an oxide compound thereof; phosphonic acid, and the like, but are not limited thereto. The organic ligand compound may be used alone or as a mixture of two or more. In an embodiment, the organic ligand compound may be a combination of RCOOH and amine (e.g., $RNH_2$, $R_2NH$, and/or $R_3N$) wherein R is defined above.

In order to improve photoluminescence properties of the quantum dot(s), the use of a core-shell structure has been suggested or proposed, but most of these core-shell quantum dots having desirable properties are cadmium-based materials. Accordingly, development of cadmium-free semiconductor nanocrystal particles having desirable photoluminescence properties is desired. It is desirable to develop a material exhibiting improved electroluminescence properties, when applied to or present in an electroluminescent device as cadmium-free quantum dots. Indium phosphide exhibits relatively low efficiency, when applied to an electroluminescent device, and ZnSe-based quantum dots may not easily provide light of a green wavelength having improved electroluminescence properties. The quantum dot(s) of an embodiment may emit green light of a desired wavelength with improved efficiency. In addition, the quantum dots of an embodiment may exhibit improved peak external quantum efficiency (Max EQE) and maximum luminance in an electroluminescent device described later.

In another embodiment, a method of producing the quantum dot(s) of an embodiment includes
obtaining a core including a first semiconductor nanocrystal including zinc, selenium, and tellurium particles (hereinafter, also referred to as a core); and
forming a semiconductor nanocrystal shell including zinc, selenium, and sulfur on the surface of the core by reacting at least one non-metal precursor such as a zinc precursor, a selenium precursor, or a sulfur precursor through a plurality of processes at a shell-forming temperature in an organic solvent under presence of the core particle and the organic ligand.

The forming of the semiconductor nanocrystal shell may include reacting the zinc precursor and the selenium precursor and then, reacting the zinc precursor and the sulfur precursor.

Details of the core(s) are described as above. In an embodiment, the core may be obtained by preparing a zinc precursor solution including a zinc precursor and an organic ligand; preparing a selenium precursor and a tellurium precursor; heating the zinc precursor solution at a core-forming reaction temperature, and adding the selenium precursor and the tellurium precursor together with optionally an organic ligand to perform the core-forming reaction. A content of the selenium precursor may be less than or equal to about 10 moles (mol), for example, less than or equal to about 9 mol, or less than or equal to about 8 mol, per 1 mol of the tellurium precursor. The amount of the selenium precursor may be greater than or equal to about 2 mol, for example, greater than or equal to about 3 mol, greater than or equal to about 4 mol, or greater than or equal to about 5 mol, per 1 mol of the tellurium precursor.

The zinc precursor may include a Zn metal powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, or a combination thereof. Examples of the zinc precursor may be dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The selenium precursor may include selenium-trioctyl phosphine (Se-TOP), selenium-tributyl phosphine (Se-TBP), selenium-triphenyl phosphine (Se-TPP), selenium-diphenyl phosphine (Se-DPP), or a combination thereof, but is not limited thereto.

The tellurium precursor may include tellurium-tributyl phosphine (Te-TBP), tellurium-triphenyl phosphine (Te-TPP), tellurium-diphenyl phosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctyl phosphine (S-TOP), sulfur-tributyl phosphine (S-TBP), sulfur-triphenyl phosphine (S-TPP), sulfur-trioctyl amine (S-TOA), sulfur-octadecene (S-ODE), bistrimethylsilyl sulfur, ammonium sulfide, sodium sulfide, or a combination thereof.

The organic solvent may include a C6 to C22 primary amine such as a hexadecyl amine, a C6 to C22 secondary amine such as dioctyl amine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, squalene, or squalane, an aromatic hydrocarbon substituted with a C6 to C30 alkyl group such as phenyl dodecane, phenyl tetradecane, or phenyl hexadecane, a primary, secondary, or tertiary phosphine (e.g., trioctylphosphine) substituted with at least one (e.g., 1, 2, or 3) C6 to C22 alkyl group, a phosphine oxide (e.g. trioctyl phosphine oxide) such as (e.g., 1, 2, or 3) substituted with a C6 to C22 alkyl group, a C12 to C22 aromatic ether such as a phenyl ether or a benzyl ether, or a combination thereof.

The organic ligand may coordinate the surface of the produced nanocrystals and may have an effect on the light emitting and electrical characteristics as well as may well disperse the nanocrystals in the solution phase. Details for the organic ligand are the same as described above.

A reaction temperature for forming the core may be greater than or equal to about 280° C., greater than or equal to about 290° C., greater than or equal to about 300° C., or greater than or equal to about 310° C. and less than or equal to about 350° C., for example, less than or equal to about 340° C. A reaction time for forming the core is not particularly limited and may be appropriately selected.

Reaction conditions such as a reaction temperature or time for shell formation may be appropriately selected considering a desired shell composition. In a non-limiting example embodiment, under a vacuum, a solvent and optionally the organic ligand are heated (or vacuum-treated) at a predetermined temperature (e.g., greater than or equal to about 100° C.), and may be heated again at predetermined temperature (e.g., greater than or equal to about 100° C.) under an inert gas atmosphere. Subsequently, the core is added, shell precursors are sequentially or simultaneously added, and then heated at a predetermined reaction temperature to perform a shell-forming reaction. A mixture having a different ratio of the shell precursors may be sequentially added for a reaction time to form a shell (e.g., and addition having a gradient or a multi-layer) having a desired composition. In an embodiment, the zinc precursor and the selenium precursor may be reacted to form a first layer, and then, the zinc precursor and the sulfur precursor may be reacted to form a second layer. A reaction temperature for forming the shell may be greater than or equal to about 280° C., for example, greater than or equal to about 290° C., or greater than or equal to about 300° C. and less than or equal to about 330° C., for example, less than or equal to about 325° C.

In the reaction system, amounts and concentrations of each precursor may be selected considering compositions of the core and shell and reactivity between precursors. For example, molar ratios relative to each precursor may be adjusted considering the desired compositions (Zn, S, Se) of the final quantum dots. The compositions of the final quantum dots may be confirmed by appropriate analytical means such as an inductively coupled plasma-atomic emission spectroscopy.

After completing the reaction, a nonsolvent is added to reaction products and nanocrystal particles coordinated to the ligand compound may be separated. The nonsolvent may be a polar solvent that is miscible with the solvent used in the core formation and/or shell formation reactions and is not capable of dispersing the produced nanocrystals therein. The nonsolvent may be selected depending the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, ethylene glycol, a solvent having a similar solubility parameter to the foregoing solvents, or a combination thereof. The nanocrystals may be separated through centrifugation, sedimentation, chromatography, or distillation. The separated nanocrystals may be added to a washing solvent and washed, if necessary. The washing solvent has no particular limit and may have a similar solubility parameter to that of the ligand and may, for example, include hexane, heptane, octane, chloroform, toluene, benzene, and the like.

In another embodiment, an electronic device includes the aforementioned quantum dots. The device may include a display device, a light emitting diode (LED), an organic light emitting diode (OLED), a quantum dot LED, a sensor, a solar cell, an imaging sensor, or a liquid crystal display, but is not limited thereto.

In an embodiment, the electronic device may be a photoluminescent device (e.g., a lighting device such as a quantum dot sheet or a quantum dot rail, a liquid crystal display (LCD), etc.) or an electroluminescent device (e.g., QD LED). In another non-limiting embodiment, the electronic device may include a quantum dot sheet and the aforementioned semiconductor nanocrystal particles may be included in a quantum dot sheet (e.g., in a form of a semiconductor nanocrystal-polymer composite).

In an embodiment, the electronic device may be a liquid crystal display (LCD), a photoluminescent device (e.g., a quantum dot sheet, a quantum dot rail, or a lighting device), an electroluminescent device (e.g., QD LED), or a backlight unit.

In another non-limiting embodiment, the electronic device may include a quantum dot sheet and the aforementioned quantum dots may be included in a quantum dot sheet (e.g., in a form of a semiconductor nanocrystal-polymer composite).

In a non-limiting embodiment, the electronic device may be an electroluminescent device. The electronic device may include an anode 1 and a cathode 5 facing each other and quantum dot emission layer 3 disposed between the anode and the cathode and including a plurality of quantum dots, wherein the plurality of quantum dots may include the aforementioned blue light emitting semiconductor nanocrystal particle (refer to FIG. 1).

The cathode may include an electron injecting conductor (e.g., having a relatively low work function). The anode may include a hole injection conductor (e.g., having a relatively high work function). The electron/hole injection conductor may include a metal-based material (e.g., a metal, a metal compound, an alloy, or a combination thereof) (aluminum, magnesium, tungsten, nickel, cobalt, platinum, palladium, calcium, LiF, and the like), a metal oxide such as gallium indium oxide, indium tin oxide, and the like, or a conductive polymer (e.g., having a relatively high work function) such as polyethylene dioxythiophene, but is not limited thereto.

At least one of the cathode and the anode may be a light-transmitting electrode or a transparent electrode. In an embodiment, the anode and the cathode may be all light-transmitting electrodes. The electrode may be patterned.

The light-transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer but is not limited thereto. If one of the cathode and the anode is a non-light transmitting electrode, it may be made of, for example, an opaque conductor such as aluminum (Al), a lithium aluminum (Li:Al) alloy, a magnesium-silver alloy (Mg:Ag), or lithium fluoride-aluminum (LiF:Al).

The light-transmitting electrode may be disposed on a (e.g., insulating) transparent substrate. The substrate may be rigid or flexible. The substrate may be a plastic, glass, or a metal.

Thicknesses of the anode and the cathode are not particularly limited and may be appropriately selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 μm, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots may include a blue light emitting semiconductor nanocrystal particle according to the aforementioned embodiments. The quantum dot emission layer may include a monolayer of blue light emitting semiconductor nanocrystal particles.

The quantum dot emission layer may be formed by applying dispersion in which the quantum dots are dispersed in a solvent by spin coating, inkjet or spray coating, and then drying the resultant. The emission layer may be formed to have a thickness of greater than or equal to about 5 nm, greater than or equal to about 10 nm, greater than or equal to about 15 nm, greater than or equal to about 20 nm, or greater than or equal to about 25 nm and less than or equal to about 200 nm, for example less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

AS shown in FIG. 1, the electronic device may include a charge (hole or electron) auxiliary layer between the anode and the cathode. For example, the electronic device may include a hole auxiliary layer 2 or an electron auxiliary layer 4 between the anode and the quantum dot emission layer and/or between the cathode and the quantum dot emission layer.

In the drawing, the hole/electron auxiliary layer may be formed as a monolayer. However, the hole/electron auxiliary layer may be formed of plural layers including two or more stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be appropriately selected. For example, each thickness of the layer may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating, etc.) such as PEDOT:PSS. The hole transport layer may be an organic layer that is formed by a solution process (e.g., spin coating, etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be appropriately selected. For example, each thickness of the layer may be greater than or equal to about 1 nm, greater than or equal to about 5 nm, greater than or equal to about 10 nm, greater than or equal to about 15 nm, greater than or equal to about 20 nm, or greater than or equal to about 25 nm and, less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The electron injection layer may be an organic layer formed by deposition. The electron transport layer may include an inorganic oxide nanoparticle or may be an organic layer formed by deposition.

The quantum dot emission layer may be disposed in the hole injection (or transport) layer or an electron injection (or transport) layer or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer (HIL) may each independently include, for example, poly(3,4-ethylenedioxythiophene):poly(styrenesulfonate) (PEDOT:PSS), poly(9,9-dioctyl-fluorene-co-N-(4-butylphenyl)-diphenyl amine) (TFB), polyaryl amine, poly (N-vinylcarbazole) (PVK), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenyl amine (m-MTDATA), 4,4',4"-tris(N-carbazolyl)-triphenyl amine (TCTA), 1,1-bis [(di-4-tolylamino)phenylcyclohexane (TAPC), a p-type metal oxide (e.g., NiO, WO$_3$, MoO$_3$, etc.), a carbon-based material such as graphene oxide, or a combination thereof, but is not limited thereto.

The electron blocking layer (EBL) may include, for example poly(3,4-ethylenedioxythiophene):poly(styrenesulfonate) (PEDOT:PSS), poly(9,9-dioctyl-fluorene-co-N-(4-butylphenyl)-diphenyl amine) (TFB) polyaryl amine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenyl amine (TCTA), or a combination thereof, but is not limited thereto.

The electron transport layer (ETL) and/or the electron injection layer (EIL) may each independently include, for example, 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, HfO$_2$, etc.), or a combination thereof, but is not limited thereto. The n-type metal oxide may be crystalline. The n-type metal oxide may be a nanoparticle. The electron transport layer may include crystalline nanoparticles including zinc oxide (e.g. ZnO).

The hole blocking layer (HBL) may include for example at least one such as 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq3, Inq3, Znq2, Zn(BTZ)$_2$, BeBq$_2$, or a combination thereof, but is not limited thereto.

Herein, q indicates 8-hydroxyquinoline, BTZ indicates 2-(2-hydroxyphenyl)benzothiazolate, and Bq indicates 10-hydroxybenzo[h]quinolone.

Figure 2:
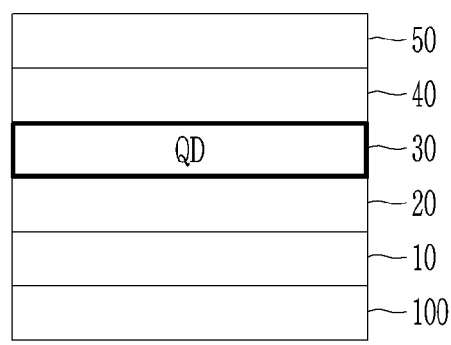
FIG. 2 is a schematic cross-sectional view of a QD LED device according to non-limiting embodiment.

A device according to an embodiment may have a normal structure. As shown in FIG. 2, in a device according to an embodiment, an anode 10 disposed on a transparent substrate 100 may include a metal oxide-based transparent electrode (e.g., ITO electrode) and a cathode 50 facing the anode 10 may include a metal (Mg, Al etc.) having a predetermined (relatively low) work function. For example, a hole auxiliary layer 20 may be disposed between the transparent electrode 10 and the emission layer 30, as a hole transport layer 20 including TFB and/or PVK, and/or as a hole injection layer including PEDOT:PSS and/or p-type metal oxide. An electron auxiliary layer (e.g., electron transport layer) 40 may be disposed between the quantum dot emission layer 30 and the cathode 50.

Figure 3:
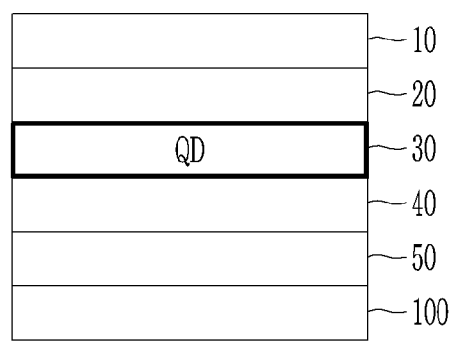
FIG. 3 is a schematic cross-sectional view of a QD LED device according to non-limiting embodiment.

A device according to another embodiment may have an inverted structure as shown in FIG. 3. A cathode 50 disposed on the transparent substrate 100 may include a metal oxide-based transparent electrode (e.g., ITO) and an anode 10 facing the cathode may include a metal (Au, Ag, etc.) having a predetermined (e.g., relatively high) work function. For example, n-type metal oxide (ZnO) and the like may be disposed between the transparent electrode 50 and the emission layer 30 as an electron auxiliary layer (e.g., electron transport layer) 40. A hole auxiliary layer 20 (e.g., hole transport layer including TFB and/or PVK and/or a hole injection layer including MoO$_3$ or other p-type metal oxides) may be disposed between the metal anode 10 and the quantum dot emission layer 30.

The electroluminescent device according to an embodiment may emit green light with an improved level of EQE. The electroluminescent device may have peak external quantum efficiency of greater than or equal to about 4%, for example, 5%, greater than or equal to about 6%, or greater than or equal to about 7%. The electroluminescent device may emit light having a maximum luminance greater than or equal to about 5,000 cd/m$^2$, greater than or equal to about 6,000 cd/m$^2$, greater than or equal to about 7,000 cd/m$^2$, greater than or equal to about 8,000 cd/m$^2$, greater than or equal to about 9,000 cd/m$^2$, greater than or equal to about 10,000 cd/m$^2$, greater than or equal to about 11,000 cd/m$^2$, greater than or equal to about 12,000 cd/m$^2$, greater than or equal to about 13,000 cd/m$^2$, greater than or equal to about 14,000 cd/m$^2$, or greater than or equal to about 15,000 cd/m$^2$.

Hereinafter, specific examples are presented. However, these examples are exemplary, and the present disclosure is not limited thereto.

EXAMPLES

Analysis Methods

Photoluminescence Analysis

Photoluminescence (PL) spectra of the produced nanocrystals are obtained using a Hitachi F-7000 spectrometer at an irradiation wavelength of 450 nm.

UV Spectroscopy

A Hitachi U-3310 spectrometer is used to perform a UV spectroscopy and obtain UV-Visible absorption spectra.

ICP Analysis

An inductively coupled plasma-atomic emission spectroscopy (ICP-AES) is performed using Shimadzu ICPS-8100.

XRD Analysis

An XRD analysis is performed using a Philips XPert PRO equipment with a power of 3 kW.

Electroluminescence Spectroscopy

A current depending on a voltage is measured using a Keithley 2635B source meter while applying a voltage, and EL light emitting luminance is measured using a CS2000 spectroscopy.

Syntheses are performed under inert gas atmospheres (nitrogen-flowing conditions), unless particularly mentioned.

Reference Example 1

Selenium and sulfur are dispersed in trioctyl phosphine (TOP) to obtain 2 M (moles per liter (molar)) of a Se/TOP stock solution and 2 M of a S/TOP stock solution.

0.9 millimoles (mmol) of zinc acetate and oleic acid are dissolved in trioctyl amine in a 300 milliliter (mL) reaction flask and heated at 120° C. under vacuum. After one hour, an inert atmosphere is introduced into the reaction flask and the reaction flask is heated at greater than or equal to 200° C.

Subsequently, the Se/TOP stock solution and the Te/TOP stock solution are rapidly injected into the reaction flask, and then, the temperature is increased to 300° C. (a temperature for forming a core) for 40 minutes. The reaction solution is rapidly cooled down to room temperature, and ethanol is added to facilitate formation or separation of a precipitate. The precipitate is obtained through centrifugation and dispersed in toluene to obtain a ZnTeSe core. The amounts of Se/TOP stock solution and the Te/TOP stock solution injected into the reaction flask such that Se is used in an amount of 2.8 moles (mol) with respect to 1 mol of Te.

The obtained ZnTeSe core is subjected to a UV spectroscopic analysis. The obtained core has a first absorption peak in a relatively high energy region.

Figure 4:
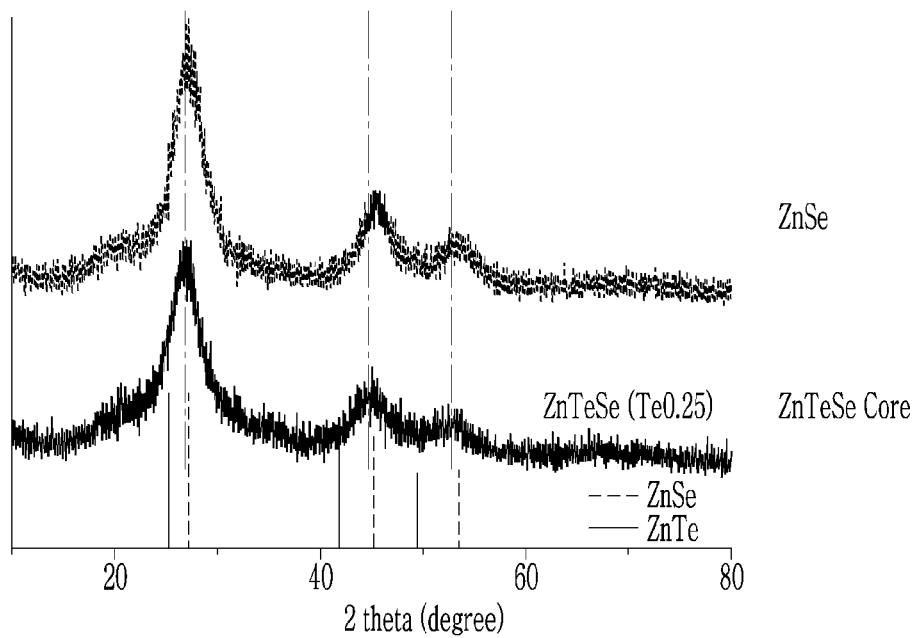
FIG. 4 shows X-ray diffraction spectra of the synthesized core in Example.
Figure 5:
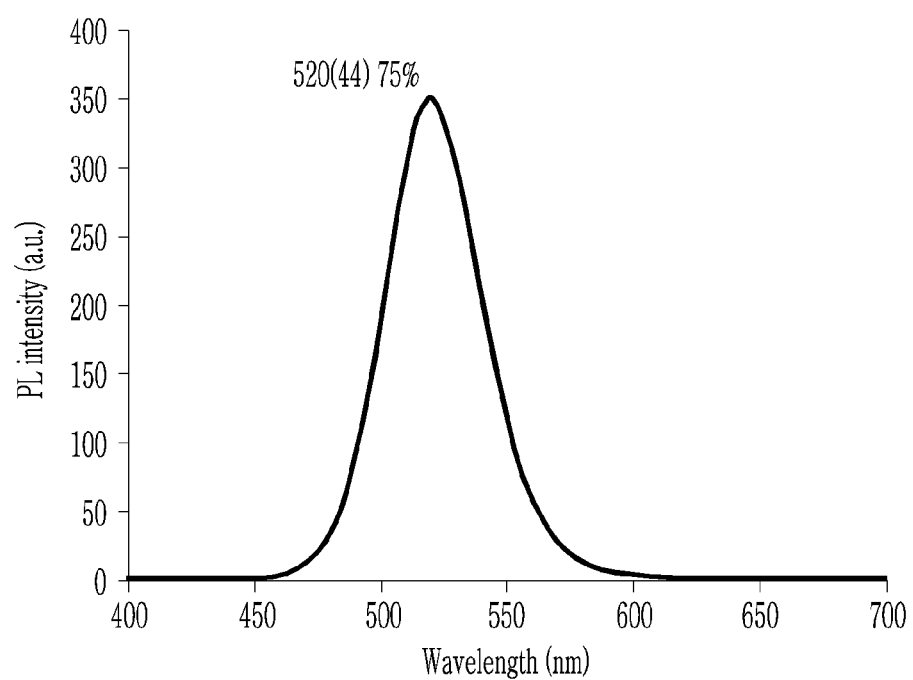
FIG. 5 shows a PL spectrum of the synthesized core shell quantum dot in Example.

The obtained ZnTeSe core is subjected to an X-ray diffraction analysis, shown in FIG. 4. Referring to the results of FIG. 4, the obtained core includes a ZnTeSe alloy.

The obtained ZnTeSe core is subjected to an ICP analysis, and the results are shown in Table 1.

Reference Example 2

A core is synthesized according to the same method as Reference Example 1 except that a selenium precursor is used in an amount of 3.7 mol with respect to 1 mol of a tellurium precursor.

The obtained ZnTeSe core is subjected to an ICP analysis, and the results are shown in Table 1.

Reference Example 3

A core is synthesized according to the same method as Reference Example 1 except that a selenium precursor is used in an amount of 4 mol with respect to 1 mol of a tellurium precursor.

The obtained ZnTeSe core is subjected to an ICP analysis, and the results are shown in Table 1.

Reference Example 4

A core is synthesized according to the same method as Reference Example 1 except that a selenium precursor is used in an amount of 5.3 mol with respect to 1 mol of a tellurium precursor.

The obtained ZnTeSe core is subjected to an ICP analysis, and the results (mole ratio of Te/Se) are shown in Table 1.

TABLE 1

| Samples | moles | |
|---|---|---|
| | Se | Te |
| Reference Example 1 | 1.00 | 0.36 |
| Reference Example 2 | 1.00 | 0.27 |
| Reference Example 3 | 1.00 | 0.25 |
| Reference Example 4 | 1.00 | 0.19 |

Example 1

Trioctyl amine (TOA) is put in a 300 mL reaction flask, zinc acetate and oleic acid are added to the flask and then, vacuum-treated at 120° C. The flask is internally substituted with nitrogen ($N_2$). As the reaction flask is heated to 300° C., the ZnTeSe core according to Reference Example 4 is rapidly added as a toluene dispersion, and the Se/TOP stock solution is subsequently added to the reaction flask and reacted for 60 minutes to form a ZnSe layer on the core. Subsequently, the S/TOP stock solution along with zinc acetate is added to the flask and then, reacted for 100 minutes to form a ZnS layer.

An inductively coupled plasma-atomic emission spectroscopy (ICP-AES) for the produced quantum dot is performed, and the results are shown in Table 2. The ratio of Te/Se is 0.0744 and Te/S is 0.069.

A photoluminescence characteristic analysis for the produced quantum dot is performed, and the results are shown in Table 3.

Example 2

A core shell quantum dot is manufactured according to the same method as Example 1 except that the core according to Reference Example 3 is used.

An inductively coupled plasma-atomic emission spectroscopy (ICP-AES) for the produced quantum dot is performed, and the results are shown in Table 2. The ratio of Te/Se is 0.08 and Te/S is 0.074.

A photoluminescence characteristic analysis for the produced quantum dot is performed, and the results are shown in Table 3.

Example 3

A core shell quantum dot is manufactured according to the same method as Example 1 except that the core according to Reference Example 2 is used.

An inductively coupled plasma-atomic emission spectroscopy (ICP-AES) for the produced quantum dot is performed, and the results are shown in Table 2. The ratio of Te/Se is 0.0625 and Te/S is 0.054.

A photoluminescence characteristic analysis for the produced quantum dot is performed, and the results are shown in Table 3.

Example 4

A core shell quantum dot is manufactured according to the same method as Example 1 except that the core according to Reference Example 1 is used.

An inductively coupled plasma-atomic emission spectroscopy (ICP-AES) for the produced quantum dot is performed, and the results are shown in Table 2. The ratio of Te/Se is 0.051 and Te/S is 0.037.

A photoluminescence characteristic analysis for the produced quantum dot is performed, and the results are shown in Table 3.

Comparative Example 1

A core shell quantum dot is manufactured according to the same method as Example 1 except that the core according to Reference Example 4 is used, and S/TOP is not used.

An inductively coupled plasma-atomic emission spectroscopy (ICP-AES) for the produced quantum dot is performed, and the results are shown in Table 2. The ratio of Te/Se is 0.0775 and the ratio of Te/S is not available as the content of S is zero.

A photoluminescence characteristic analysis for the produced quantum dot is performed, and the results are shown in Table 3.

Comparative Example 2

A core shell quantum dot is manufactured according to the same method as Example 1 except that the core according to Reference Example 4 is used, and the mol ratio of the S precursor and the Se precursor is changed.

An inductively coupled plasma-atomic emission spectroscopy (ICP-AES) for the produced quantum dot is performed, and the results are shown in Table 2. The ratio of Te/S is 0.133. The ratio of Te/Se is 0.079

A photoluminescence characteristic analysis for the produced quantum dot is performed, and the results are shown in Table 3.

TABLE 2

| | ICP results | | | |
|---|---|---|---|---|
| | S + Se (moles) | S:Se (mole ratio) | Te (moles) | S:Zn (mole ratio) |
| Example 1 | 27.94 | 1.08:1 | 1.00 | 0.432:1 |
| Example 2 | 25.94 | 1.09:1 | 1.00 | 0.3796:1 |
| Example 3 | 34.54 | 1.16:1 | 1.00 | 0.447:1 |
| Example 4 | 46.4 | 1.37:1 | 1.00 | 0.509:1 |
| Comparative Example 1 | 12.90 | 0 | 1.00 | 0 |
| Comparative Example 2 | 20.14 | 0.60:1 | 1.00 | 0.28:1 |

TABLE 3

| | Excitation with 458 nm | | |
|---|---|---|---|
| Coating | Luminous Peak wavelength (nm) | FWHM (nm) | QY (%) |
| Example 1 | 520 | 44 | 75 |
| Example 2 | 520 | 48 | 76 |
| Example 3 | 527 | 49 | 65 |
| Example 4 | 529 | 44 | 72 |
| Comparative Example 1 | 520 | 49 | 45 |
| Comparative Example 2 | 520 | 48 | 37 |

Referring to the results of Tables 2 and 3, the quantum dots according to Examples emit green light with an improved quantum efficiency and a reduced full width at half maximum (FWHM) in comparison with the quantum dots according to Comparative Examples.

Example 5

The quantum dots of Example 1 are used to manufacture an electroluminescent device in the following method: On a glass substrate deposited with an ITO electrode (an anode), a poly(3,4-ethylenedioxythiophene):poly(styrenesulfonate) (PEDOT:PSS) layer and a poly(N-vinylcarbazole) (PVK) layer or a poly(9,9-dioctyl-fluorene-co-N-(4-butylphenyl)-diphenyl amine) (TFB) layer are respectively formed as a hole injection layer (HIL) and a hole transport layer (HTL) in a spin coating method, respectively. On the PVK layer, an octane dispersion of the quantum dots is spin-coated to form a quantum dot emission layer. On the quantum dot emission layer, 8-(4-(4,6-di(naphthalen-2-yl)-1,3,5-triazin-2-yl)phenyl)quinolone:8-hydroxyquinolinato lithium (ET204:Liq) is formed as the electron auxiliary layer, and then, an Al electrode is deposited thereon.

Electroluminescence properties of the manufactured device are evaluated. As a result, the device exhibits EQE of about 7 percent and maximum luminance of 15,000 candela per square meter (cd/m$^2$).

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. Quantum dots comprising zinc, selenium, tellurium, and sulfur,
    wherein the quantum dots are configured to emit green light having a maximum peak wavelength of greater than or equal to 500 nanometers and less than or equal to 550 nm,
    wherein the quantum dots as a whole have a mole ratio Te:Se of tellurium relative to selenium of greater than about 0.05:1 and less than or equal to about 0.5:1,
    wherein the quantum dots do not include cadmium, and the quantum dots exhibit a quantum efficiency of greater than or equal to 60% or a full width at half maximum of less than or equal to 50 nanometers, and
    wherein the quantum dots as a whole have a mole ratio of sulfur to zinc that is greater than or equal to about 0.3:1.

2. The quantum dots of claim 1, wherein the green light has a maximum peak wavelength of greater than or equal to about 515 nanometers and less than or equal to about 535 nanometers.

3. The quantum dot of claim 1, wherein in the quantum dots, the mole ratio Te:Se of tellurium relative to selenium is greater than or equal to about 0.055:1 and less than or equal to about 0.49:1.

4. The quantum dots of claim 1, wherein an average particle size of the quantum dots is greater than or equal to about 6 nanometers and less than or equal to about 50 nanometers.

5. The quantum dots of claim 1, wherein the quantum efficiency of the quantum dots greater than or equal to about 63%.

6. The quantum dots of claim 5, wherein the quantum dots have a quantum efficiency of greater than or equal to 65%.

7. The quantum dots of claim 1, wherein the quantum dots exhibit a quantum efficiency of greater than or equal to 65% and a full width at half maximum of less than or equal to 48 nanometers.

8. The quantum dot of claim 1, wherein in the quantum dots, the mole ratio Te:Se of tellurium relative to selenium is greater than or equal to about 0.06:1 and less than or equal to about 0.45:1.

9. The quantum dots of claim 1, wherein in the quantum dots
    a mole ratio S:Se of sulfur relative to selenium is greater than or equal to about 0.5:1 and less than or equal to about 2.0:1; or
    a mole ratio of a sum of sulfur and selenium relative to tellurium is greater than or equal to about 15:1; or
    a mole ratio of zinc relative to a sum of sulfur and selenium is less than or equal to about 1.1:1.

10. The quantum dots of claim 1, wherein in the quantum dots,
    a mole ratio of sulfur to zinc is greater than or equal to about 0.35:1 and less than or equal to about 0.8:1, or
    a mole ratio of tellurium to sulfur is greater than or equal to about 0.02:1 and less than or equal to about 0.2:1.

11. An electronic device, comprising the quantum dots of claim 1.

12. The electronic device of claim 11, wherein the quantum dots are included in a form of a semiconductor nanocrystal polymer composite.

13. A display device, comprising the quantum dots of claim 1.

14. An electroluminescent device, comprising
    a first electrode and a second electrode; and
    a quantum dot emission layer disposed between the first electrode and the second electrode, the emission layer comprising the quantum dots of claim 1.

15. The quantum dots of claim 1, wherein the quantum dots have a standard deviation of a particle size distribution of less than or equal to about 10 percent of an average size of the quantum dots.

* * * * *